United States Patent [19]
Hasnain et al.

[11] Patent Number: 5,136,603
[45] Date of Patent: Aug. 4, 1992

[54] SELF-MONITORING SEMICONDUCTOR LASER DEVICE

[75] Inventors: Ghulam Hasnain, Edison; Kuochou Tai, North Plainfield, both of N.J.

[73] Assignee: AT&T Bell Laboratories, Murray Hill, N.J.

[21] Appl. No.: 692,746

[22] Filed: Apr. 29, 1991

[51] Int. Cl.⁵ .............................................. H01S 3/19
[52] U.S. Cl. ......................................... 372/50; 357/19
[58] Field of Search ........................... 372/50, 92, 108; 357/17, 19

[56] References Cited

U.S. PATENT DOCUMENTS

| | | | |
|---|---|---|---|
| 4,967,241 | 10/1990 | Kinoshita et al. | 357/19 |
| 4,969,152 | 11/1990 | Burghardt et al. | 372/50 |
| 5,020,066 | 5/1991 | Iga et al. | 372/49 |

FOREIGN PATENT DOCUMENTS 2197122  5/1988  United Kingdom .................. 357/19

*Primary Examiner*—James W. Davie
*Attorney, Agent, or Firm*—Glen E. Books

[57] ABSTRACT

The present invention is a semiconductor laser having an integral photodiode and/or modulator. The integrated structure comprises a quantum well active region sandwiched between a pair of distributed Bragg reflector stacks for emitting laser light transverse to the planes of growth. An intrinsic layer and a doped semiconductor layer are disposed on one of the reflector stacks for forming, in combination with the outer layer of the stack, a photodiode in the path of emitted light. The diode can be used either to monitor the laser power or to modulate the laser output. The device is particularly suited for fabrication and testing in large arrays and, in addition, has the advantages of a circular, low divergence optical output, inherently single mode operation, and a high two-dimensional packing density.

7 Claims, 3 Drawing Sheets

SELF-MONITORING SEMICONDUCTOR LASER DEVICE

FIELD OF THE INVENTION

This invention relates to semiconductor lasers and, in particular, to a self-monitoring, vertical cavity surface emitting laser suitable for fabrication in large planar arrays.

BACKGROUND OF THE INVENTION

Semiconductor lasers are attractive for a wide variety of applications including optical interconnection of integrated circuits, telecommunications, computing systems and optical recording systems. Semiconductor lasers provide a compact source of coherent, monochromatic light which can be modulated at high bit rates to transmit large amounts of information. Because aging and temperature changes vary the level of laser output, semiconductor lasers typically require monitoring circuits to provide dynamic stabilization of the laser output.

Unfortunately the geometry of conventional edge emitting lasers does not favor easy integration with the other components used in semiconductor laser systems. Edge emitting lasers emit coherent light along an embedded planar surface parallel to the substrate surface. Thus the lasting direction is parallel to the planes of growth in typical semiconductor processes. As a consequence, edge emitting lasers are typically fabricated and tested as discrete devices. In use edge emitting lasers are typically combined with separately fabricated modulators and photodiodes. Thus fabrication of a semiconductor laser system typically involves time-consuming assembly and alignment of plural discrete components.

SUMMARY OF THE INVENTION

The present invention is a semiconductor laser having an integral photodiode and/or modulator. The integrated structure comprises a quantum well active region sandwiched between a pair of distributed Bragg reflector stacks for emitting laser light transverse to the planes of growth. An intrinsic layer and a doped semiconductor layer are disposed on one of the reflector stacks for forming, in combination with the outer layer of the stack, a photodiode in the path of emitted light. The diode can be used either to monitor the laser power or to modulate the laser output. The device is particularly suited for fabrication and testing in large arrays and, in addition, has the advantages of a circular, low divergence optical output, inherently single mode operation, and a high two-dimensional packing density.

BRIEF DESCRIPTION OF THE DRAWING

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphical illustrations, are not to scale.

DETAILED DESCRIPTION

Figure 1:
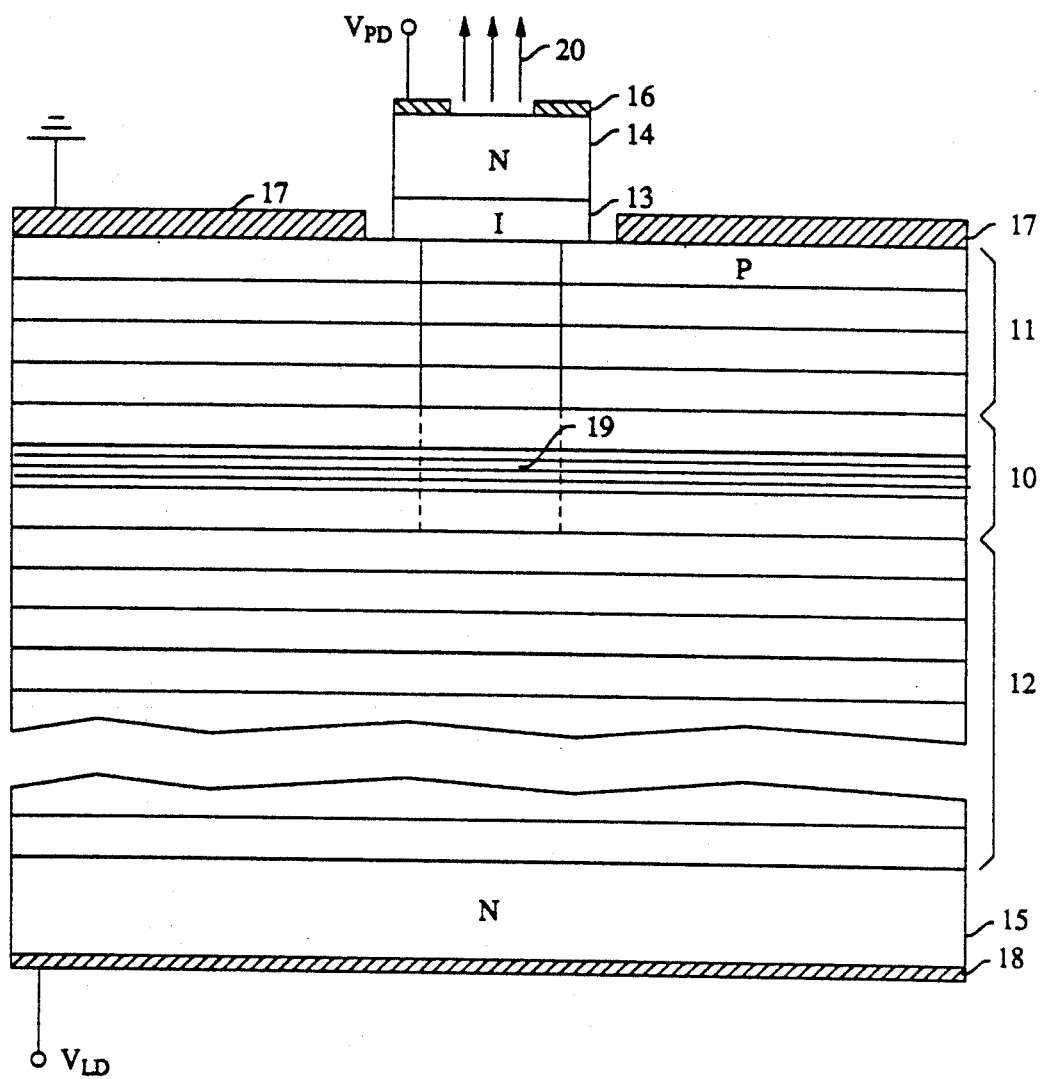
FIG. 1 is a schematic cross section of a preferred embodiment of the invention.

Referring to the drawing, FIG. 1 is a schematic cross section of an integrated structure in accordance with the invention comprising, in essence, a quantum well active region 10 disposed between a pair of distributed Bragg reflector stacks 11 and 12. Disposed on one of the stacks are an intrinsic semiconductor layer 13 and an overlying doped semiconductor layer 14 which, together with the outer layer of the stack, form a photodiode in the path of emitted light. Alternatively, layer 13 can be a multiple quantum well structure consisting of alternate barrier layers and well layers. The photodiode can be used to monitor laser power or to modulate the laser beam.

In the preferred embodiment, the device is fabricated on a gallium arsenide substrate 15 doped with impurities of a first conductivity type (e.g. n-type). The quantum well active region 10 comprises alternating layers of aluminum gallium arsenide barrier layers and gallium arsenide well layers, and the reflector stacks 11 and 12 comprise periodic layers of doped aluminum gallium arsenide and aluminum arsenide. In the lower stack 12 adjacent the substrate, the aluminum gallium arsenide is doped with the same type impurity as the substrate (e.g. n-type). In the upper stack 11, the aluminum gallium arsenide is doped with the other type impurity (e.g. p-type).

Semiconductor layer 13 is preferably intrinsic gallium arsenide, and doped semiconductor layer 14 is preferably n-doped aluminum gallium arsenide.

Annular ohmic contacts 16 and 17 are formed on layer 14 and the outer layer of upper stack 11, respectively. These contacts, in cooperation with an ohmic contact 18 to the substrate allow appropriate electrical biasing of either or both diodes. When the laser diode is forward biased using contacts 17 and 18, the active region 19 emits light 20 passing through upper stack 11 and layers 13 and 14. In this structure, layers 13 and 14 together with the outer layer of stack 11 operate as a photodiode integrally formed in the path of emitted light. The photodiode when biased using contacts 16 and 17 can be used to either monitor the laser power or to modulate the laser beam.

Figure 2:
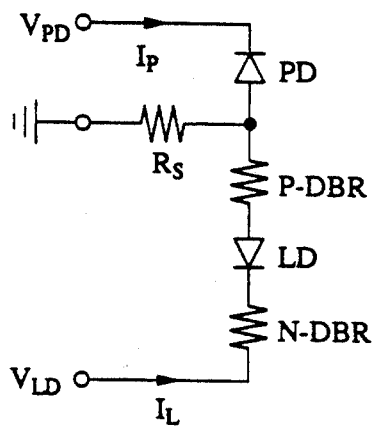
FIG. 2 is a schematic circuit diagram showing the effective interconnection between the photodiode and the laser in the device of FIG. 1.

FIG. 2 is an equivalent circuit diagram of the photodiode/laser diode device of FIG. 1. The photodiode is designated PD and the laser diode LD. The laser diode voltage with respect to ground is designated $V_{PD}$, the current, $I_p$. The laser diode voltage is $V_{LD}$ and the laser current, $I_L$. P-DBR and N-DBR represent the resistances presented by the distributed Bragg reflectors.

If photodiode $I_P$ is applied to a feedback circuit for controlling the laser current $I_L$, the integrated structure behaves as a self-monitoring laser. On the other hand, if a modulated bias voltage is applied between $V_{PD}$ and ground, variation in the bias will change the absorption coefficient and refractive index of the photodiode, thereby modulating the amplitude and/or phase of the laser output. In this mode, the structure operates as an integrated laser and modulator.

The structure, fabrication and operation of the invention can be understood in greater detail by consideration of the following specific example of fabrication of such a device. The preferred device can be conveniently fabricated by molecular beam epitaxy (MBE).

The first step is to provide a substrate 15 of n-doped gallium arsenide and to grow by MBE the sequence of layers comprising the FIG. 1 device, including the bottom reflector stack 12, the quantum well active region 10, the upper reflector stack 11, the intrinsic semiconductor layer 13 and the doped semiconductor layer 14.

The bottom reflector stack 12 is fabricated by growing a stair case distributed Bragg reflector comprising thirty periods of layers. Each period consists of 385 angstroms of $Al_{0.15}Ga_{0.85}As$, 125 angstroms of $Al_{0.4}Ga_{0.6}As$, 125 angstroms of $Al_{0.7}Ga_{0.3}As$, 450 angstroms of AlAs, 125 angstroms of $Al_{0.7}Ga_{0.3}As$ and 125 angstroms of $Al_{0.4}Ga_{0.6}As$. The AlGaAs layers are doped with n-type impurity e.g. silicon to a concentration of $10^{18}$ cm$^{-3}$.

The quantum well region 10 is grown by MBE on the lower reflector stack 12. As a preliminary step, a graded spacer layer of $Al_xGa_{1-x}As$ is grown on stack 12. The thickness of the spacer layer is preferably chosen so that the central antinode of standing waves will overlap the quantum wells. In this example the thickness if about 2200 angstroms, and x is graded from 0.6 to 0.3. The quantum well region grown on the spacer layer comprises four quantum wells consisting of 100 angstrom well layers of GaAs and 80 angstrom barrier layers of $Al_{0.2}Ga_{0.8}As$. A second 2200 angstrom graded $Al_xGa_{1-x}As$ spacer layer is grown over the region. The two graded spacer layers sandwich the quantum well active region to form a confinement heterostructure for efficient carrier trapping.

The upper reflector stack 11 is grown on the quantum well region 10 and, in particular, on the upper graded spacer layer of region 10. The upper stack 11 is similar to the lower stack 12 except that stack 11 is p-doped rather than n-doped, and stack 11 comprises fewer periods than stack 12 so that light 20 will be emitted. Specifically, stack 11 can be doped with Be to a concentration of $3 \times 10^{18}$ cm$^{-3}$ and comprise 20 periods instead of 30.

The intrinsic semiconductor layer 13 is formed by growing a layer of undoped gallium arsenide on the p-doped outer layer of stack 11. Preferably layer 13 has a thickness of one-half wavelength of the emitted light in order to center an antinode within layer 13 for efficient absorption.

The top layer of doped semiconductor 14 is grown as n-doped AlGaAs on layer 13. The thickness of layer 14 is preferably three quarters of a wavelength, e.g. 1820 angstroms.

After the constituent layers are grown, the next step is to form ohmic contacts and to laterally confine the current. Ohmic contact 16 is formed to contact n-doped layer 14 by depositing a composite layer of Au/Ge/Ag/Au having respective component thicknesses of 120, 270, 500 and 1000 angstroms. The composite metal layer is photolithographically patterned to form an annular ring 16 with an outer diameter of about 20 micrometers and an inner diameter of 10 micrometers.

Advantageously, upon formation of ohmic contact 16, layer 11 is subjected to proton implantation to confine current to the region underlying the ring. This can be effected by protecting the inner circle of the ring with a 15 micrometer diameter concentric circle of six micron thick photoresist (not shown) and exposing the unprotected portion of the surface to proton implantation at a dosage of $10^{15}$ cm$^{-2}$ at 300 keV. Implantation at this energy produces an ion displacement profile peaked at a depth of 2.5 micrometers. The structure is then annealed at 450° C. for 30 seconds. The result is a highly resistive buried layer formed by implant damage which funnels current through the 15 micrometer diameter active region that was masked.

Using the contact ring 16 and the 15 micrometer photoresist circle as an etch mask, a 0.5 micrometer deep mesa can be etched around ring 16, terminating on an AlGaAs surface of stack 11. Preferably reactive ion etching is used in order to obtain a mesa with vertical side walls at the periphery of ring 16.

Next ohmic contact 17 is made with the now exposed p-doped $Al_{0.15}Ga_{0.85}As$ layer as by depositing a composite layer of AuBe/Ti/Au having respective component thickness of 800/200/1500 angstroms and photolighographically defining around the mesa an annular contact ring having a 30 micrometer inner diameter and a 50 micrometer outer diameter.

The final step is forming an ohmic contact 18 with the n-doped gallium arsenide substrate, as by alloying the substrate with indium to a copper heat sink (not shown). The device is now ready for testing and operation.

Figure 3:
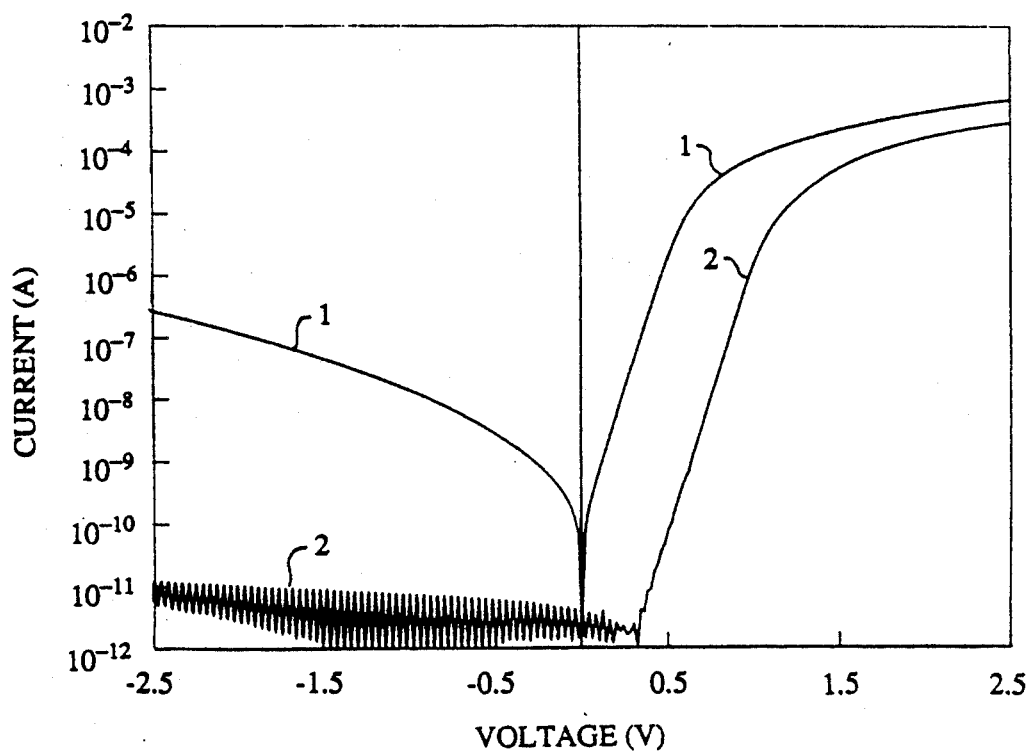
FIG. 3 is a graphical illustration showing the dark current-voltage characteristics of the diodes comprising the device of FIG. 1.
Figure 4:
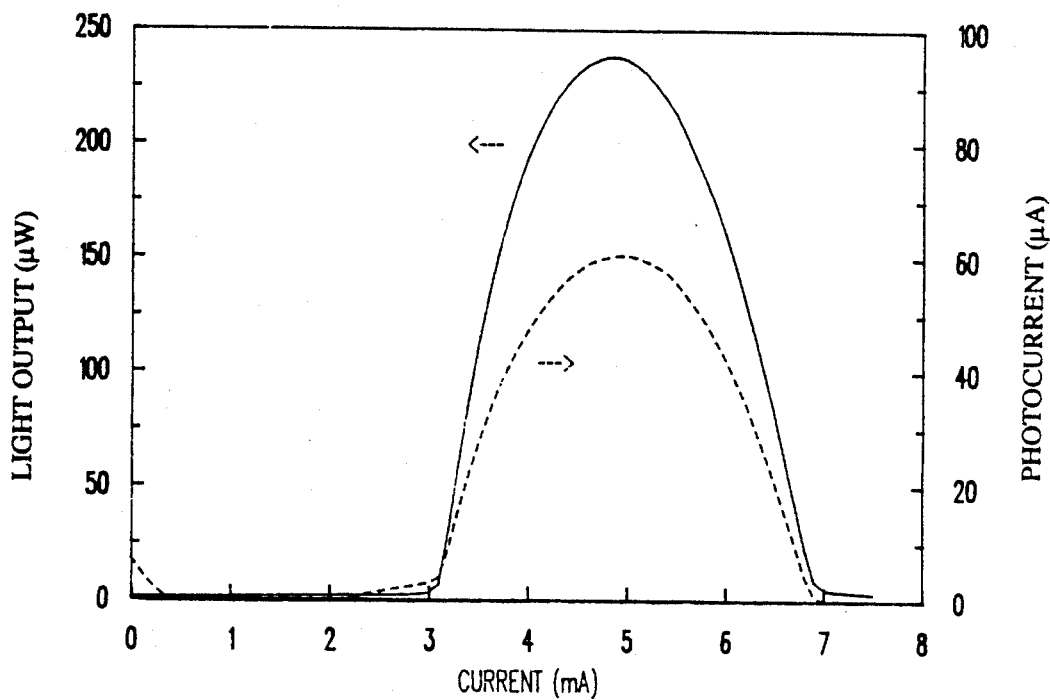
FIG. 4 is a graphical illustration showing the typical light output vs. current characteristics of the laser diode in the device of FIG. 1.
Figure 5:
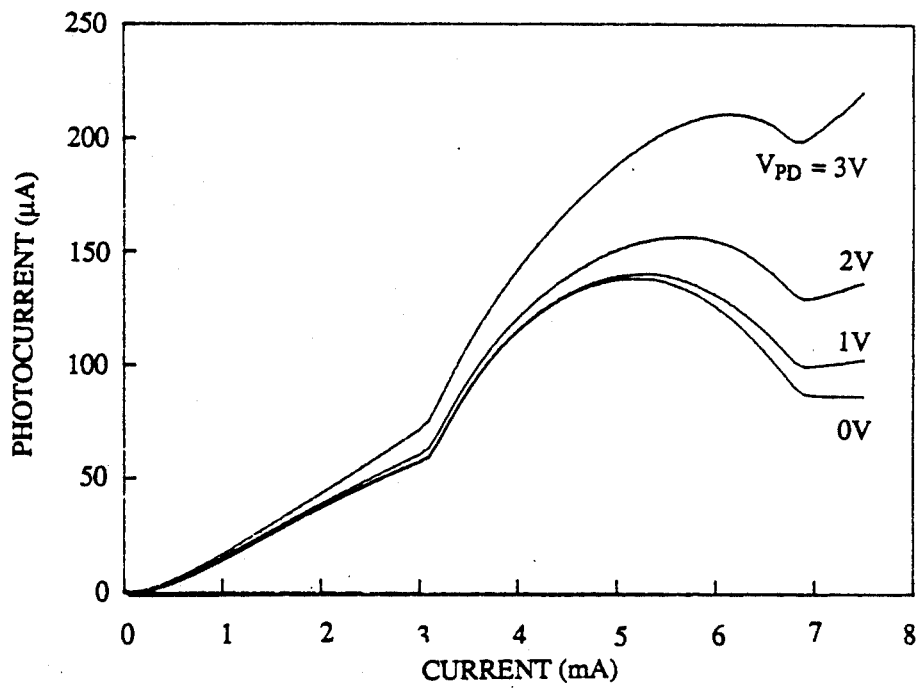
FIG. 5 is a graphical illustration showing, at different reverse bias voltages, the photodiode current versus the laser forward injection current.

The characteristics of the device are shown in FIGS. 2–4. FIG. 2 is a graphical illustration showing the dark I-V characteristics of both the photodiode between contacts 16 and 17 (curve 1) and the laser diode between contacts 17 and 18 (curve 2). The forward characteristics of both diodes have an ideality factor of 2, characteristic of double heterostructure light emitting diodes.

FIG. 3 shows a typical light output versus current characteristics of the surface emitting laser. The solid curve shows the light output power measured by an external calibrated, broad area silicon detector. The dotted curve shows the corrected photocurrent of the integrated photodetector/laser when current due to spontaneous emission and reverse leakage is subtracted out. When the laser is forward biased between the outer annular contact 17 and the substrate contact 18, at a threshold current of 3.2 mA, the device at room temperature lases continuous wave at 850 nanometers in a single longitudinal and transverse mode.

FIG. 4 shows the photodiode current, at different reverse bias voltages, as the forward injection current to the laser is increased. In each case, the photodiode current abruptly increases at the onset of lasing. The corrected peak photocurrent (FIG. 3) is 60 microamperes when the surface emitting laser output is 0.24 mW, giving an effective responsivity of 0.25 A/W. Thus the integral photodiode provides 25 microamperes of photocurrent per 100 microwatts of emitted laser power, an amount of photocurrent adequate to stabilize the laser output.

It is to be understood that the above-described embodiments are illustrative of only a few of the many possible specific embodiments which can represent applications of the principles of the invention. For Example, both a photodiode and a modulator can be integrated with the laser, e.g. at opposite sides to form an integrated structure that includes laser, monitoring photodiode and modulator. Moreover, while the invention has been described in the context of a preferred gallium arsenide materials system, other materials systems, such as indium phosphide can also be used. Thus numerous and varied other arrangements can be made by those skilled in the art without departing from the spirit and scope of the invention.

We claim:

1. A semiconductor laser device comprising:
   surface emitting laser means comprising a quantum well region disposed between a pair of reflector stacks for emitting coherent light perpendicular to said reflector stacks;
   photodiode means integrally formed overlying one of said reflector stacks in the path of light emitted from said quantum well active region; and
   contact means for making ohmic contact with said surface emitting laser and said photodiode.

2. A device according to claim 1 wherein one of said pair of reflector stacks comprises a layer doped with n-type impurities and the other of said pair comprises a layer doped with p-type impurity; and
   said photodiode means comprises an intrinsic layer disposed on a doped layer of one of said stacks and, upon said intrinsic layer, a layer of semiconductor doped with the other type of impurity from that of said doped layer of said one stack.

3. A device according to claim 2 wherein said photodiode means comprises an intrinsic layer disposed on a p-doped layer of one of said stacks and, upon said intrinsic layer, a layer of n-doped semiconductor.

4. A device according to claim 1 wherein said quantum well region comprises aluminum gallium arsenide barrier layers and gallium arsenide well layers.

5. A device according to claim 4 wherein said reflector stacks comprise periodic layers of aluminum gallium arsenide and aluminum arsenide.

6. A device according to claim 4 wherein said intrinsic semiconductor layer is gallium arsenide.

7. A device according to claim 1 comprising an n-doped gallium arsenide substrate;
   a first reflector stack grown on said substrate, said stack comprising periodic layers of aluminum gallium arsenide and aluminum arsenide;
   a quantum well region grown on said first stack, said region comprising aluminum gallium arsenide barrier layers and gallium arsenide well layers;
   a second reflector stack grown on said quantum well region; said second stack comprising periodic layers of aluminum gallium arsenide and aluminum arsenide;
   an intrinsic layer of gallium arsenide grown on said second reflector stack; and
   a layer of n-doped aluminum gallium arsenide grown on said intrinsic layer.

* * * * *